United States Patent
Takemura et al.

(10) Patent No.: US 10,955,447 B2
(45) Date of Patent: Mar. 23, 2021

(54) FAULT WAVEFORM RECORDING DEVICE

(71) Applicant: MITSUBISHI ELECTRIC CORPORATION, Tokyo (JP)

(72) Inventors: Satoshi Takemura, Tokyo (JP); Shigetoo Oda, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 302 days.

(21) Appl. No.: 16/076,882

(22) PCT Filed: Feb. 19, 2016

(86) PCT No.: PCT/JP2016/054909
§ 371 (c)(1),
(2) Date: Aug. 9, 2018

(87) PCT Pub. No.: WO2017/141430
PCT Pub. Date: Aug. 24, 2017

(65) Prior Publication Data
US 2019/0049490 A1  Feb. 14, 2019

(51) Int. Cl.
*G01R 19/25* (2006.01)
*H02H 3/06* (2006.01)
*H02H 3/04* (2006.01)

(52) U.S. Cl.
CPC ..... *G01R 19/2509* (2013.01); *G01R 19/2513* (2013.01); *H02H 3/04* (2013.01); *H02H 3/06* (2013.01)

(58) Field of Classification Search
CPC .............. G01R 31/3275; G01R 31/327; G01R 31/333; G01R 31/3333; G01R 31/3272;
(Continued)

(56) References Cited

U.S. PATENT DOCUMENTS

| 6,768,430 | B1* | 7/2004 | Weinstein | G01R 13/342 |
| | | | | 341/61 |
| 2014/0063876 | A1* | 3/2014 | Buckey | G01R 31/327 |
| | | | | 363/50 |
| 2015/0316593 | A1* | 11/2015 | Oda | G01R 19/2513 |
| | | | | 702/60 |

FOREIGN PATENT DOCUMENTS

JP 05-346443 A 12/1993
JP 11-299081 A 10/1999
(Continued)

OTHER PUBLICATIONS

International Search Report (PCT/ISA/210) dated Apr. 26, 2016, by the Japanese Patent Office as the International Searching Authority for International Application No. PCT/JP2016/054909.
(Continued)

*Primary Examiner* — Matthew G Marini
(74) *Attorney, Agent, or Firm* — Buchanan Ingersoll & Rooney PC

(57) ABSTRACT

In a fault waveform recording device, a first storage stores data detected in a power system, the data being up-to-date and indicating an electrical quantity during a first period, and halts the updating of the data stored in the first storage after a second period has elapsed since an abnormality detection time at which an abnormality in the power system is detected. The second period is shorter than the first period. First operation unit stores data in a first interval as is into a second storage, among the data of the first period stored in the first storage after the updating of the data stored in the first storage is halted, the first interval including the abnormality detection time, and decimates data in a second interval different from the first interval.

8 Claims, 16 Drawing Sheets

(58) Field of Classification Search
CPC ...... G01R 19/2509; G01R 22/00; G01R 1/00; G01R 11/00
See application file for complete search history.

(56) References Cited

FOREIGN PATENT DOCUMENTS

| | | |
|---|---|---|
| JP | 2009-289204 A | 12/2009 |
| JP | 2014-093823 A | 5/2014 |
| WO | WO 2014/141464 A1 | 9/2014 |

OTHER PUBLICATIONS

Written Opinion (PCT/ISA/237) dated Apr. 26, 2016, by the Japanese Patent Office as the International Searching Authority for International Application No. PCT/JP2016/054909.
Notification of Reasons for Refusal for Japanese Patent Application No. 2016-555361 dated Nov. 10, 2016 (8 total pages).

* cited by examiner

FAULT WAVEFORM RECORDING DEVICE

TECHNICAL FIELD

The present disclosure relates to a fault waveform recording device which records waveforms of an electrical quantity (current and/or voltage) in the event of a fault in a power system, and is suitably employed in a protection relay device, for example.

BACKGROUND ART

One of functions of the protection relay device is recording of waveforms of current/voltage in the event of a fault in power system. The waveforms are recorded to analyze the situations of the fault. The requirements specification of a user, such as power companies, in recording the fault waveforms is as follows.

First, in order to, for example, accurately analyze a fault, a sampling rate at which fault waveforms are recorded is required to be kept high. Second, a waveform recording time of about a few seconds to about a few tens of seconds is required because: a series of operations, including output of a re-trip signal after reclosing, needs to be recorded; and depending on a subject to be protected, a delay trip signal is output after the expiration of a timer, or a trip signal for backup protection is output after a certain period of time has elapsed. Third, several dozen waveform records may be required to be saved in the protection relay device because, in recent years, with increasing unattended substations and unattended switching stations, etc., it is becoming difficult to frequently retrieve recorded waveforms from the protection relay device.

For example, Japanese Patent Laying-Open No. 2009-289204 is a prior art document related to the present disclosure. Specifically, the document discloses an onboard data recording system having multiple record modes in which different types of data are recorded at different sampling rates, the multiple record modes being switchable.

CITATION LIST

Patent Document

PTD 1: Japanese Patent Laying-Open No. 2009-289204

SUMMARY OF INVENTION

Technical Problem

By the way, for example, a busbar protection relay device meeting all the requirements specification described above may result in requiring an excessively large memory storage capacity. For example, use of a non-volatile memory, such as a flash memory, to store waveform data leads to an increase in price of the device, which is not economical.

In this regard, PTD 1, although related to the onboard data recording system such as a dash cam, discloses a method which switches sampling rates, thereby allowing reduction in amount of data to be stored. However, according to the technology disclosed in this document, the record mode is switched from a low sampling mode to a high sampling mode when a fault event prediction means determines that a fault is highly likely to occur. It is practically difficult for a protection relay device for a power system to provide such a fault event prediction means.

The present disclosure is made in view of the above problems, and provides a fault waveform recording device which allows reduction in amount of waveform data to be stored in the event of a fault in power system. Other objects and novel features will become apparent from the description herein and the accompanying drawings.

Solution to Problem

The present invention is a fault waveform recording device which includes a first storage; a second storage; and a first operation unit. The first storage stores data detected in a power system when the power system is normal, while successively updating the data, the data being up-to-date and indicating an electrical quantity during a first period, and halts the updating of the data stored in the first storage after a second period has elapsed since an abnormality detection time at which an abnormality in the power system is detected. The second period is shorter than the first period. The first operation unit stores data in a first interval as is into the second storage, among the data of the first period stored in the first storage after the updating of the data stored in the first storage is halted, the first interval including the abnormality detection time, and decimates data in a second interval different from the first interval, among the data of the first period stored in the first storage after the updating of the data stored in the first storage is halted, and stores the decimated data into the second storage.

Advantageous Effects of Invention

According to the present invention, the data of the second interval not including the abnormality detection time is decimated. Thus, reduction in amount of waveform data to be stored in the event of a fault in power system is achieved.

DESCRIPTION OF EMBODIMENTS

Hereinafter, embodiments will be described with reference to the accompanying drawings. Note that like reference signs refer to like or corresponding parts and the description thereof will not be repeated.

Embodiment 1

Hardware Configuration of Protection Relay Device

Figure 1:
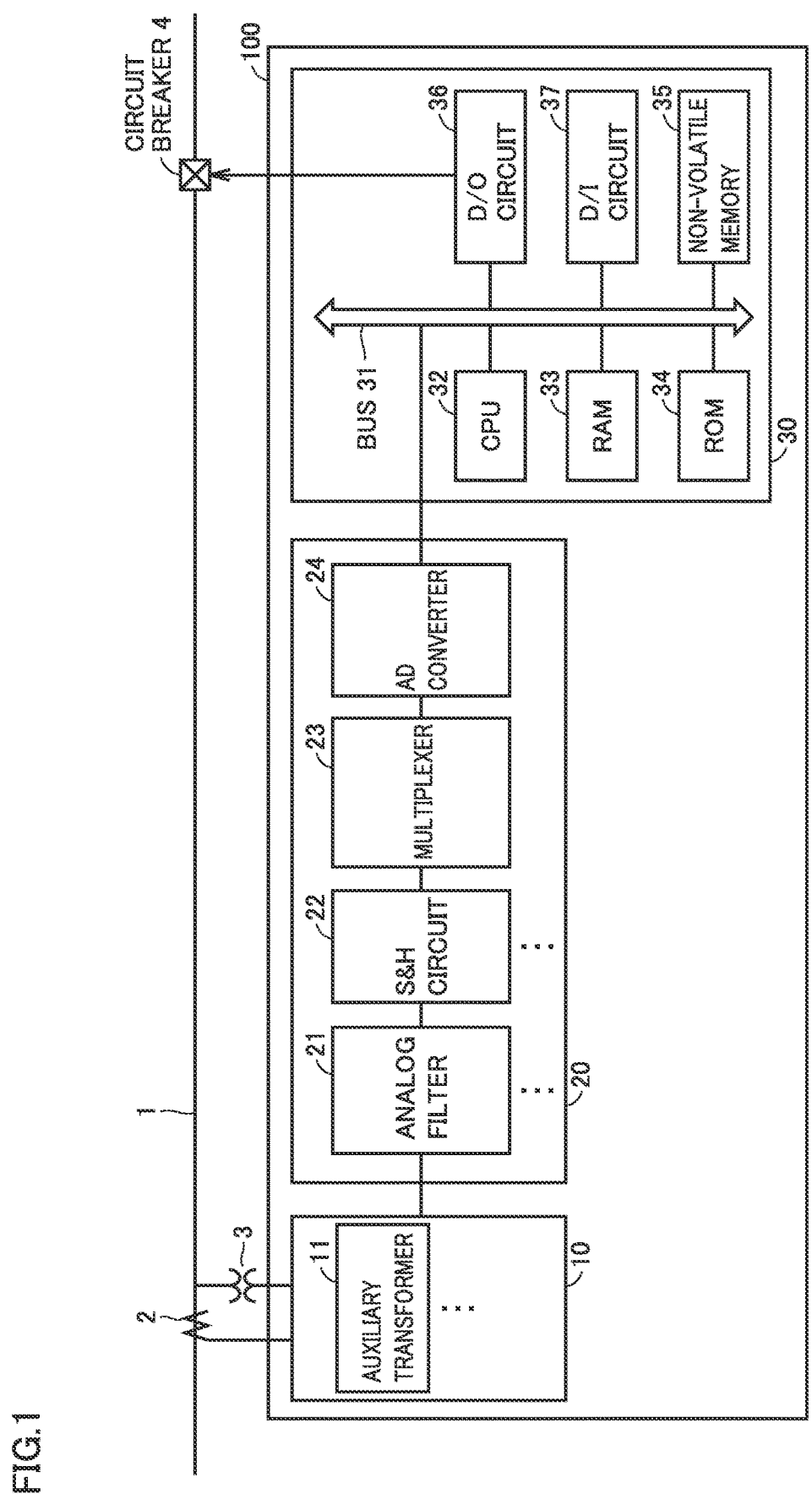
FIG. 1 is a block diagram of a hardware configuration of a protection relay device 100.

FIG. 1 is a block diagram of a hardware configuration of a protection relay device 100. FIG. 1 also shows connection between protection relay device 100 and a power system.

As shown in FIG. 1, a current transformer 2 (CT), a voltage transformer 3 (VT), and a circuit breaker 4 are installed on a power-transmission line 1 in the power system. Power-transmission line 1 is intended for three-phase alternating current, while power-transmission line 1 is simplified and shown in one line in FIG. 1. Current transformer 2, voltage transformer 3, and circuit breaker 4 are provided for each phase of power-transmission line 1.

Protection relay device 100 is connected to current transformer 2, voltage transformer 3, and circuit breaker 4 mentioned above. Current transformer 2 converts a current through power-transmission line 1 into a current having a magnitude suitable for input to protection relay device 100. The current obtained by the conversion by current transformer 2 is input to protection relay device 100. Likewise, voltage transformer 3 converts a voltage of power-transmission line 1 into a voltage having a magnitude suitable for input to protection relay device 100. The voltage obtained by the conversion by voltage transformer 3 is input to protection relay device 100. Circuit breaker 4 is connected to a digital output circuit 36 described below which is included in protection relay device 100.

Next, an internal configuration of protection relay device 100 is described. As shown in FIG. 1, protection relay device 100 includes input converter 10, an analog-to-digital (AD) converter 20, and a processing unit 30. Input converter 10 has multiple auxiliary transformers 11 built therein for each channel.

Input converter 10 is an input to which a current signal for each phase output from current transformer 2 in FIG. 1 and a voltage signal for each phase output from voltage transformer 3 in FIG. 1 are input. Auxiliary transformers 11 each convert the current signal and the voltage signal from current transformer 2 and voltage transformer 3, respectively, into a signal at a voltage level suitable for signal processing by AD converter 20 and processing unit 30.

AD converter 20 includes analog filters (AF) 21, sample and hold (S&H) circuits 22, a multiplexer (MPX) 23, and an analog-to-digital (AD) converter 24. Analog filters 21 and sample and hold circuits 22 are each provided for each channel and are in one-to-one correspondence with auxiliary transformers 11.

Each analog filter 21 is provided to remove an aliasing error in AD conversion. Each sample and hold circuit 22 samples and holds, at a predetermined sampling frequency, a signal passed through a corresponding analog filter 21. Multiplexer 23 successively selects the voltage signals held in sample and hold circuits 22. AD converter 24 converts the signal selected by the multiplexer into a digital value.

Processing unit 30 includes a central processing unit (CPU) 32, a random access memory (RAM) 33, a read only memory (ROM) 34, a non-volatile memory 35, digital output (D/O) circuit 36, a digital input (D/I) circuit 37, non-volatile memory 35, and a bus 31 connecting these components.

CPU 32 controls the overall operation of protection relay device 100, and performs relay operation, according to a program stored in ROM 34, for example. In the present embodiment, CPU 32 further serves as a fault waveform recording device and, for example, stores fault waveforms into non-volatile memory 35 and outputs the fault waveforms stored in the non-volatile memory to an external device. Here, when storing a fault waveform into non-volatile memory 35, a high sampling rate signal that exhibits a great variation in current or voltage (specifically, before and after the detection of the fault, before and after the output of a trip signal, before and after the output of a reclosing signal, etc.) is stored as the fault waveform. At other times, the data is decimated to a low sampling rate signal and stored in order to efficiently use the memory capacity of non-volatile memory 35 (the details of operation of CPU 32 as the fault waveform recording device will be described below, with reference to FIG. 2 and the subsequent figures).

RAM 33 and ROM 34 are used as primary storages of CPU 32. ROM 34 is capable of storing, for example, programs and/or settings which determine characteristics of relays. For example, a flash memory is used as non-volatile memory 35. Non-volatile memory 35 is used to store waveforms of an electrical quantity (current and/or voltage) in the event of a fault in the power system.

Digital output circuit 36 and digital input circuit 37 are interface circuits through which CPU 32 exchanges signals with outside of protection relay device 100. For example, upon detection of a fault, CPU 32 outputs a trip signal to circuit breaker 4 via digital output circuit 36.

Functional Configuration of Fault Waveform Recording Device

Figure 2:
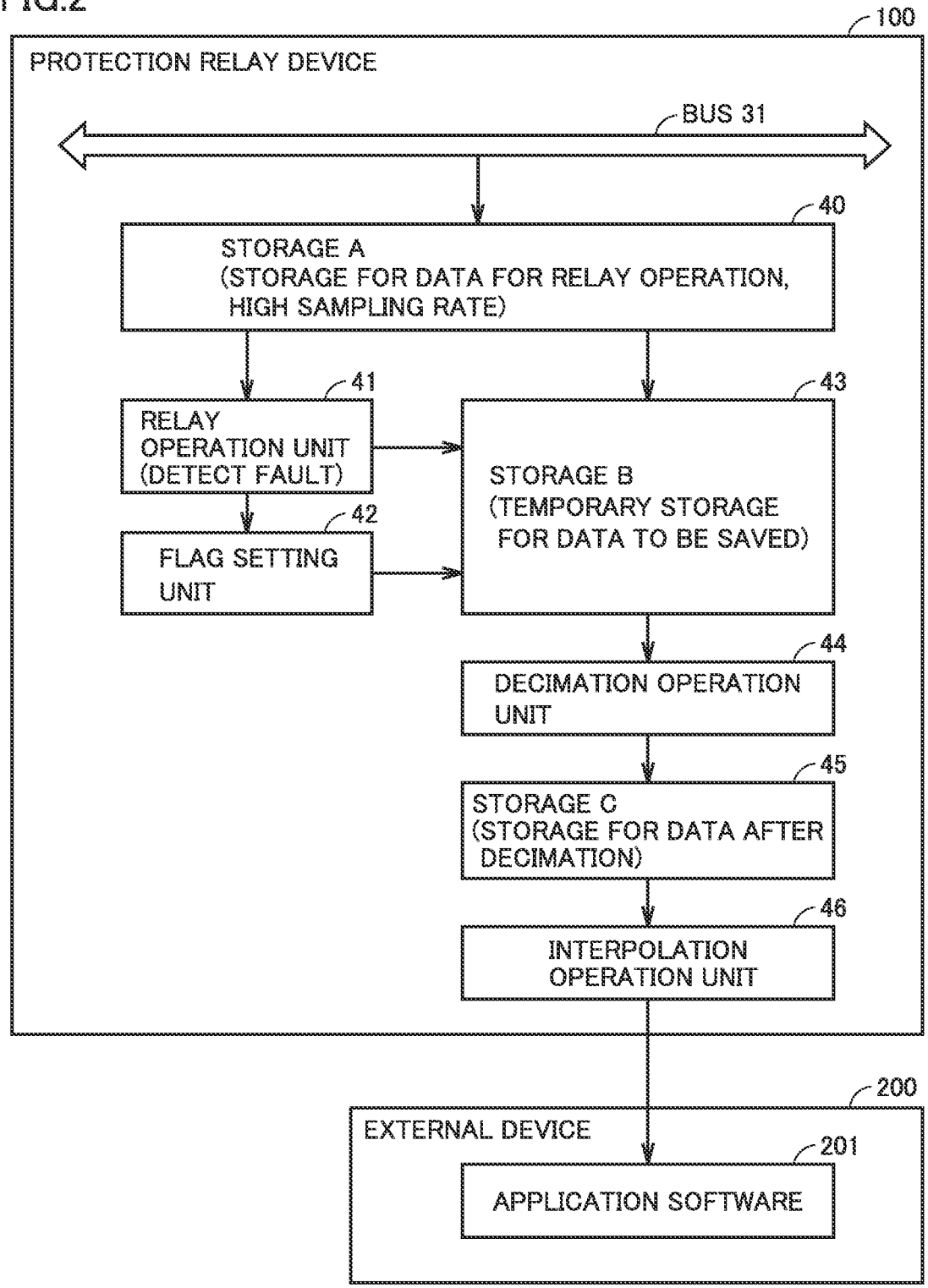
FIG. 2 is a block diagram of a functional configuration of a fault waveform recording device according to Embodiment 1.

FIG. 2 is a block diagram of a functional configuration of the fault waveform recording device according to Embodiment 1. The functions of protection relay device 100 as the fault waveform recording device, that is, the operation of each block in FIG. 2 is implemented primarily by processing unit 30 in FIG. 1.

Specifically, referring to FIG. 2, the fault waveform recording device (protection relay device 100) includes a storage A (40), a storage B (43), a storage C (45), a relay operation unit 41, a flag setting unit 42, a decimation operation unit 44, and an interpolation operation unit 46.

Storage A (40) and storage B (43) correspond to RAM 33 in FIG. 1. Storage C (45) corresponds to non-volatile memory 35 in FIG. 1. Storage A (40), storage B (43) and storage C (45) perform storing operations, according to instructions from CPU 32.

If non-volatile memory 35 is a quickly accessible non-volatile memory such as an FRAM (registered trademark) (ferroelectric random access memory) and a magnetoresistive random access memory (MRAM), storage A (40), storage B (43), and storage C (45) may be included in the same non-volatile memory. In this case, storage A (40), storage B (43), and storage C (45) correspond to different storage areas in the same non-volatile memory.

The functions of relay operation unit 41, flag setting unit 42, decimation operation unit 44, and interpolation operation unit 46 are implemented by CPU 32 in FIG. 1. In the following, functions of the above components included in the fault waveform recording device are described one by one.

1. Storage A

A signal representing the electrical quantity (current and/or voltage) detected in a power system is sampled and AD converted by AD converter 20, and then stored into storage A (40) via bus 31. Storage A stores (e.g., by First In First Out (FIFO) method) up-to-date data of a period (e.g., about five cycles) required for the relay operation by the relay operation unit while successively updating the data in storage A. The relay operation is not halted even in the event of a fault in the power system. Thus, a portion of data stored in storage A (40) is constantly replaced by up-to-date data for each sampling cycle T.

Now, for example, 4800 Hz is increasingly standardized as a sampling rate used by AD converter 20 (to be standardized as IEC61869-9). Data detected at this high sampling rate is stored into storage A (40).

2. Relay Operation Unit

Relay operation unit 41 performs the relay operation, based on the high sampling rate time-series data stored in storage A, thereby determining whether a fault is occurring in the power system. Various relay operation elements can be used, for example, an overcurrent relay, an overvoltage relay, an undervoltage relay, a current sudden change relay, a voltage sudden change relay, etc. An output signal from each relay operation element, indicating an abnormality of the power system, can be used as a trigger signal for identifying an interval whose fault waveforms are to be stored.

3. Storage B

Storage B (43) temporarily stores, at a high sampling rate, fault waveform data to be saved. In order to fulfill a user demand of saving waveforms a predetermined time prior to the event of a fault, CPU 32 causes data of a Tc+Td period from time $t_0-Tc$ to time $t_0+Td$ to be stored into storage B, where $t_0$ is a time of the event of a fault. The values of Tc and Td can be set arbitrary by the user. In the following, a specific method of storing the data is described, with reference to FIGS. 3 and 4.

Figure 3:
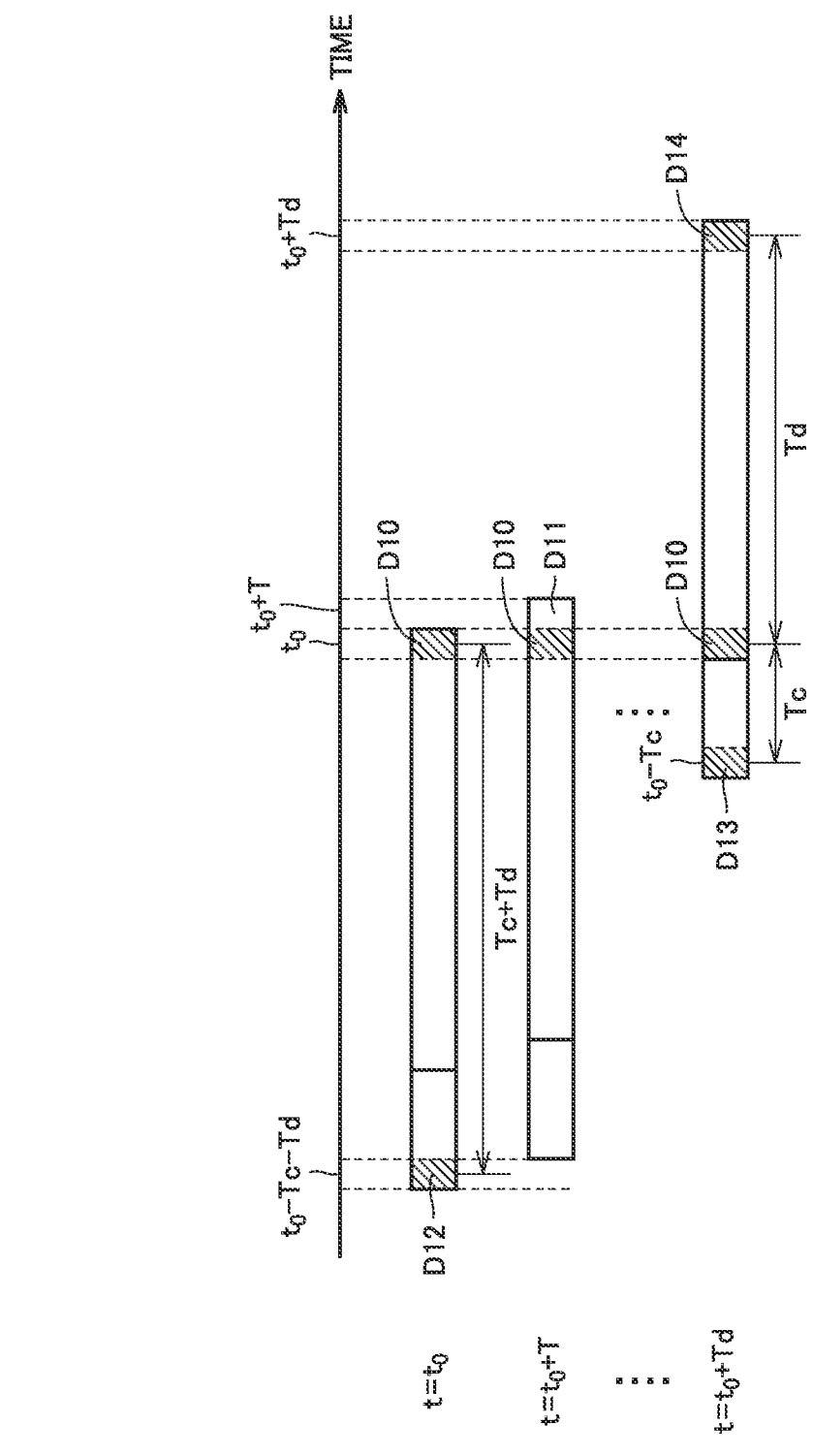
FIG. 3 is a timing chart illustrating storing operation performed by a storage B in FIG. 2.

FIG. 3 is a timing chart for illustrating a storing operation of storage B in FIG. 2. Referring to FIGS. 2 and 3, up-to-date data stored in storage A (40) is successively forwarded to storage B (43). The stored content in storage B (43) is successively updated by the FIFO method.

Specifically, suppose the current time is $t_0$ and storage B is storing data items from data D12 to data D10, the data D12 being detected at time $t_0-Tc-Td$, which is the Tc+Td period prior to the current time $t_0$, the data D10 being detected at the current time $t_0$. At the next time $t_0+T$ (where T is a sampling cycle), newly detected data D11 is stored into storage B and the oldest data D12 is removed from storage B.

In the event of a fault in the power system, the above FIFO processing continues a Td period from the event of fault. The process of storing up-to-date data into storage B (43) is halted after the period Td elapses. For example, suppose the fault has occurred at time $t_0$ (data D10 in FIG. 3 is the data detected in the event of the fault). In this case, at a time $t_0+Td$, which is a time after the period Td has elapsed since the event of the fault, multiple data items from data D13 to data D14 are stored in storage B (43), the data D13 being detected at a time $t_0-Tc$ which is Tc prior to the time $t_0$ of the event of the fault, the data D14 being detected at the time $t_0+Td$ which is Td after the time $t_0$ of the event of the fault. At this time point, updating of the data stored in storage B (43) is halted.

Figure 4:
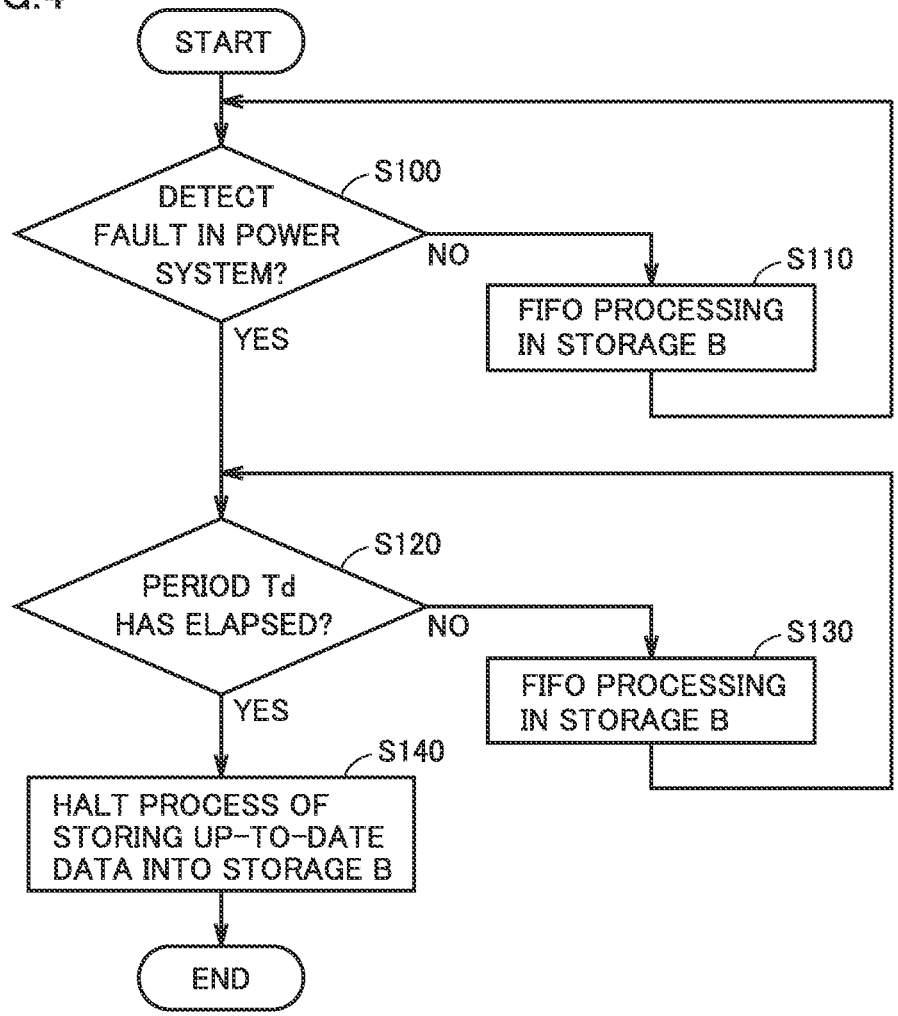
FIG. 4 is a flowchart of an operational procedure of storage B in FIG. 2.

FIG. 4 is a flowchart of an operational procedure of storage B in FIG. 2. In the following, referring to FIGS. 2 and 4, the data storage operation of storage B (43) is described in general.

Initially, when relay operation unit 41 detects no fault in the power system (NO in step S100), that is, when power system is normal, up-to-date data is stored into storage B (43) by the FIFO processing during the Tc+Td period up to the current time, while successively updating the data in storage B (43) (step S110).

On the other hand, when relay operation unit 41 detects a fault in the power system, the above FIFO operation continues (step S130) until the period Td elapses from the fault detection time (NO in step S120). Once the period Td has elapsed since the fault detection time, CPU 32 halts the process of storing up-to-date data into storage B (43) (step S140). This stores into storage B (43) data at a time the period Tc prior to the event of the fault up to data at a time the period Td after the event of the fault (i.e., data items of Tc+Td period).

4. Flag Setting Unit

Flag setting unit 42 divides the entire interval (Tc+Td period) into a high-rate interval (a first interval) and a low-rate interval (a second interval), the entire interval (Tc+Td period) being a period whose time-series data are temporarily stored in storage B (43) after updating of the data is halted. Data in the high-rate interval, that is temporarily stored in storage B (43), is to be saved at a high sampling rate into storage C (45). Data in the low-rate interval, that is temporarily stored in storage B (43), is to be converted to have a low sampling rate and saved into storage C (45). Specifically, storage B (43) has a flag storage area for each data stored therein, the flag storage area storing a flag indicating whether the data is high-rate interval data or low-rate interval data. Flag setting unit 42 sets the flag to "1" when the data is high-rate interval data, and sets the flag to "0" when the data is low-rate interval data. In the following, initially, the interval is described whose data is to be saved at a high sampling rate.

Figure 5:
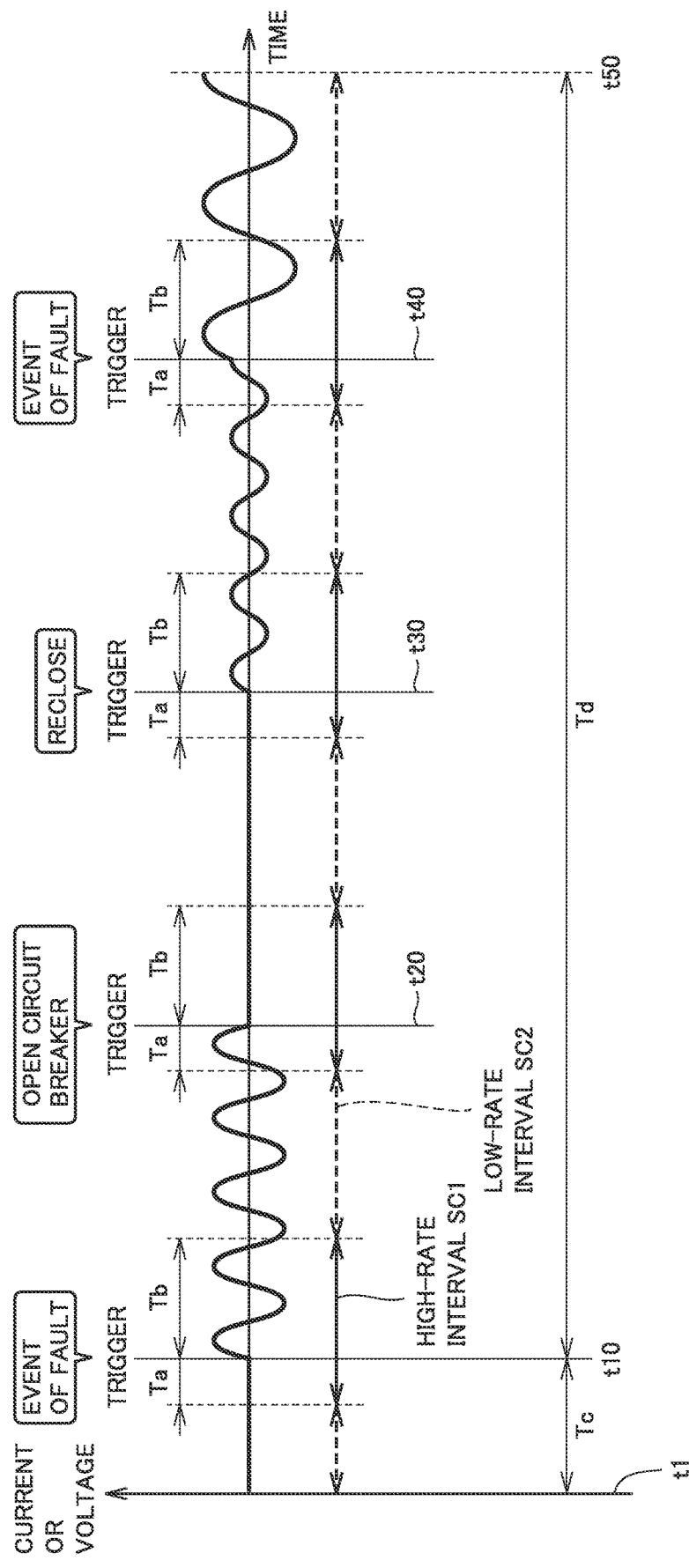
FIG. 5 is a diagram for illustrating an interval in which data needs to be saved at a high sampling rate.

FIG. 5 is a diagram for illustrating an interval whose data is to be saved at a high sampling rate. FIG. 5 shows time-series data items of Tc+Td period (from time t1 to a time t10) that are stored in storage B (43).

Referring to FIG. 5, an interval in which a portion of a current/voltage waveform exhibits a relatively great variation in current or voltage is used to accurately analyze the fault, and thus is set to a high-rate interval SC1. Specifically, a period before and after (before: period Ta, after: period Tb) fault detection time t10, a period before and after a trip signal output time (when the circuit breaker is open) t20, a period before and after a reclosing signal output time t30, and a period before and after a fault detection time t40 following the reclosing are set to high-rate intervals SC1. The remaining periods in the entire period Tc+Td (from time t1 to a time t50), other than the high-rate intervals SC1, are set to low-rate intervals SC2. FIG. 5 indicates the high-rate intervals SC1 in solid lines and the low-rate intervals SC2 in dashed lines.

Relay operation unit 41 (particularly, a current/voltage sudden change relay element) determines whether the variation in current or voltage is great. Here, the current/voltage sudden change relay detects whether the amplitude and/or the phase of the current/voltage has varied beyond a threshold that is specifically determined by the calculation (i) or (ii) below.

(i) A difference between a sample value at the current time and a sample value at a time one cycle prior to the current time is taken. If an absolute value of the difference exceeds a threshold, the flag of the data at the current time is set to "1."

(ii) The sample value at the current time and a sample value at a time half a cycle prior to the current time are added together. If an absolute value of the sum of these sample values exceeds a threshold, the flag of the data at the current time is set to "1."

(iii) Alternatively, the current/voltage sudden change relay may determine whether a result of amplitude calculation exceeds a threshold. Specifically, an amplitude Amp ($t_0$) of an electrical quantity $f(t_0)$ at the current time $t_0$ is obtained by the following Equation (1):

$$Amp(t_0) = \sqrt{\{f(t_0)^2 + f(t_0 - 90°)^2\}} \quad (1)$$

An amplitude Amp ($t_{-i}$) at time $t_{-i}$, which is i sample period(s) prior to the current time, is obtained by the following Equation (2):

$$Amp(t_{-i}) = \sqrt{\{f(t_{-i})^2 + f(t_{-i} - 90°)^2\}} \quad (2)$$

where i is a value corresponding to an electrical angle of 90 degrees, for example.

Relay operation unit 41 takes a difference between the results obtained by Equation (1) and Equation (2). If an absolute value of a result of the difference operation exceeds a threshold, the flag of the data at the current time is set to "1."

Note that the operations (i) through (iii) above also allow the determination as to whether an abnormality is occurred in the power system. Thus, use of the above operations (i) through (iii) allows relay operation unit 41 to generate both a trigger signal for identifying an interval (Tc+Td) whose fault waveforms are to be stored, and a trigger signal for identifying an interval whose waveform data is to be stored at a high sampling rate.

Figure 6:
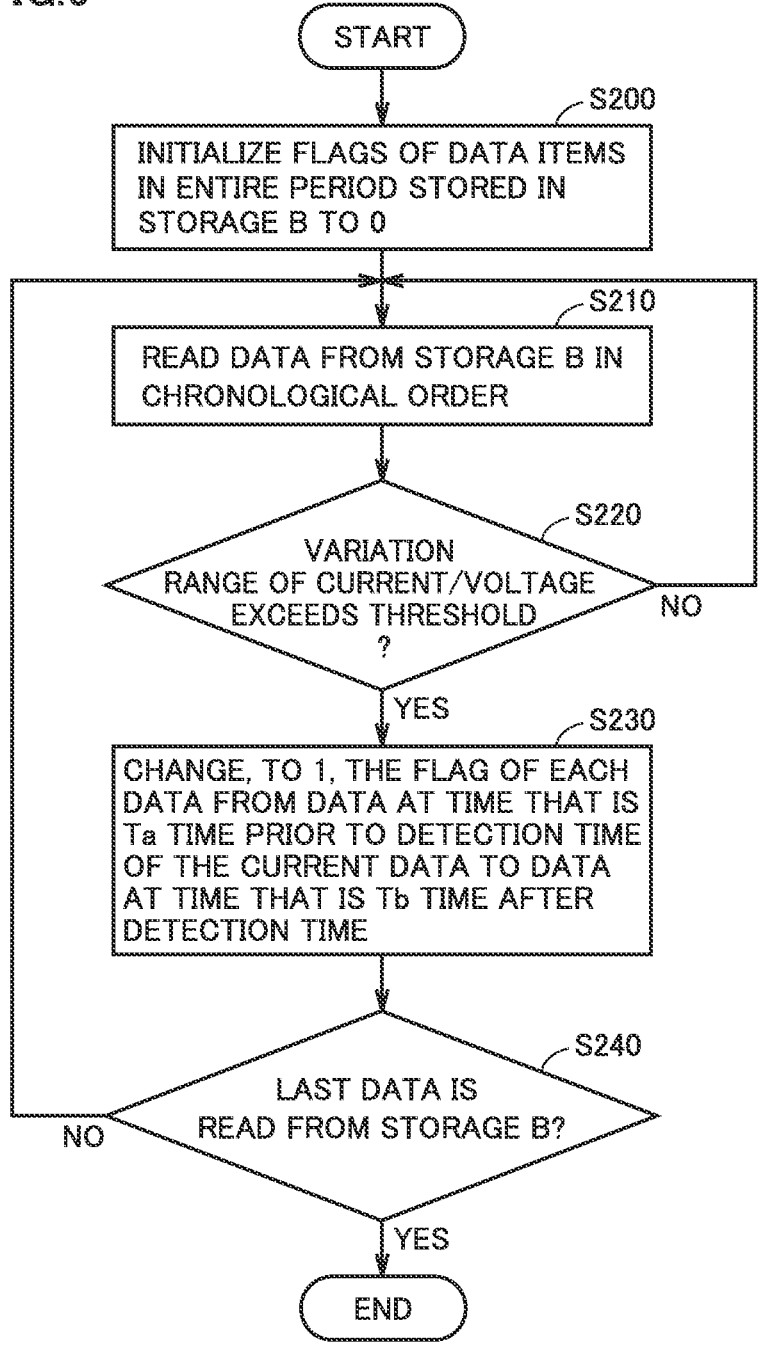
FIG. 6 is a flowchart for illustrating an operational procedure of a flag setting unit 42 in FIG. 2.

FIG. 6 is a flowchart for illustrating an operational procedure of flag setting unit 42 in FIG. 2. In the following, referring to FIG. 6, an operation of flag setting unit 42 is described in general. The procedure in FIG. 6 is performed after the process of storing up-to-date data into storage B (43) is halted in step S140 in FIG. 4.

Initially, flag setting unit 42 initializes the flags of the data items of the entire period stored in storage B (43) to 0.

Next, flag setting unit 42 reads data from storage B (43) in chronological order (successively, starting from the oldest data) (step S210), and determines whether a variation range of the current or voltage at the time the data is read (the current time) exceeds a threshold, that is, determines the variation range according to any of the determination methods (i) through (iii) (step S220). As a result, if no abnormality is determined with respect to the variation range of the current or voltage, flag setting unit 42 reads chronologically next data from storage B (43) (step S210).

On the other hand, if a variation in the current or voltage beyond the threshold is detected (YES in step S220), flag setting unit 42 changes to 1 the flag of each data from data at a time that is Ta time prior to the detection time of the current data to data at a time that is Tb time after the detection time (step S230). The foregoing steps S210, S220, S230 are repeated until the last data is read from storage B (43) (until YES in step S240).

5. Decimation Operation Unit 44, Storage C

For the data stored in storage B (43) and determined to be high-rate interval (flag: 1) data, decimation operation unit 44 stores the data as is into storage C (45). For the data stored in storage B (43) and determined to be low-rate interval (flag: 0) data, decimation operation unit 44 decimates the data and stores it into storage C (45). As a result, a sampling rate of the low-rate interval (flag: 0) data stored in storage C is low as compared to the high-rate interval (flag: 1) data stored in storage C. In the following, the description is given, with reference to a specific example.

Figure 7:
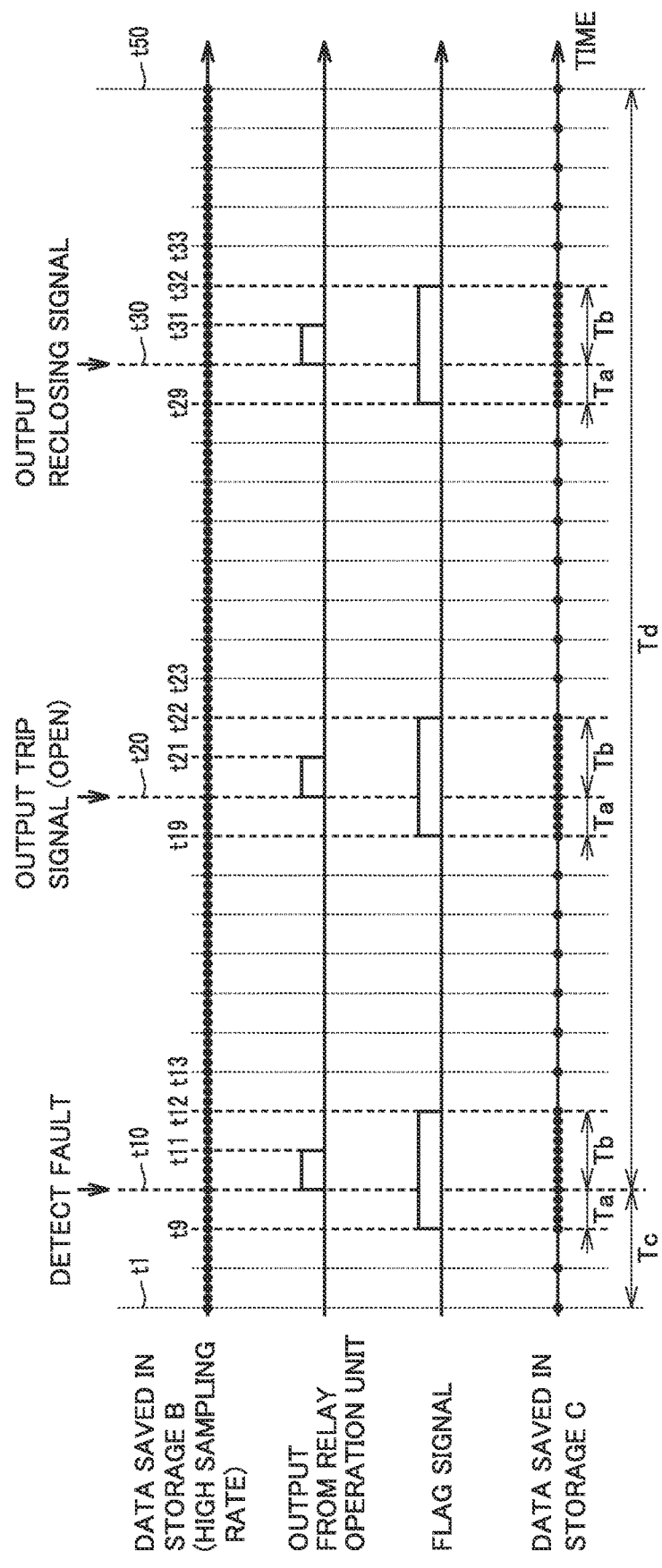
FIG. 7 is a timing chart of an example of operation of a decimation operation unit 44 in FIG. 2.

FIG. 7 is a timing chart of an example of operation of decimation operation unit 44 in FIG. 2. FIG. 7 shows time-series data of Tc+Td period (from time t1 to time t10) saved in storage B (43) (each data item is indicated by a dot).

Referring to FIGS. 2 and 7, suppose a fault in the power system is detected at time t10. In this case, relay operation unit 41 (current/voltage sudden change relay element) outputs a signal indicative of abnormality (high level: "1"). The period in which the output from relay operation unit 41 is "1" is extended by a timer from time t10 to time t11. The output signal from relay operation unit 41 is stored in storage B (43), in association with each data.

Likewise, as a result of a trip signal being output at time t20, relay operation unit 41 (current/voltage sudden change relay element) outputs a high-level ("1") signal during a period from time t20 to time t21. As a result of a reclosing signal being output at time t30, relay operation unit 41 (current/voltage sudden change relay element) outputs a high-level ("1") signal during a period from time t30 to time t31.

Using a rise of the output signal from relay operation unit 41 as a trigger, flag setting unit 42 sets the flag signal to "1" during a period before and after the rise time (before: period Ta, after: period Tb). Specifically, the flag signal is set to "1" during the period from time t9 to time t12, inclusive of fault detection time t10. The flag signal is set to "1" during the period from time t19 to time t22, inclusive of trip signal output time t20. The flag signal is set to "1" during the period from time t29 to time t32, inclusive of reclosing signal output time t30.

For the data stored in storage B (43) during the interval where the flag signal is "1," decimation operation unit 44 writes the data as is read from storage B (43) to storage C (45). For the data stored in storage B (43) during the interval where the flag signal is "1," on the other hand, decimation operation unit 44 decimates the data read from storage B (43) and writes it to storage C (45).

Specifically in the case of FIG. 7, only one of data items at consecutive four times is written to storage C (45). For example, data items at times t12, t22, and t32 are saved in storage C (45) followed by saving the data items at times t13, t23, and t33. This reduces the sampling rate to 1/4.

In the following, an example of the calculation of data compression ratio by the above data compression method is described. By way of example, suppose the system frequency is 50 Hz, and data is stored into storage A (40) at a sampling rate of 4800 Hz (high sampling rate). Suppose low-rate interval data is stored at a sampling rate of 1200 Hz (4800 Hz/4) (low sampling rate). Suppose the period (Tc+Td) whose waveforms are to be stored as fault waveforms is one second. Suppose a period during which the flag signal being "1" is output is five cycles (Ta=two cycles, Tb=three cycles), and the above one second includes three high-rate intervals.

In the example configuration above, the number of samples per cycle in high-rate interval is 4800/50=96 [samples/cycles], and the number of samples per cycle in low-rate interval is 1200/50=24 [samples/cycles].

The number of data items that are saved at the high sampling rate during the one second above where waveforms are stored as fault waveforms is calculated by the following Equation (3):

$$\text{(five cycles} \times \text{three times)} \times 96 \text{ samples} = 1440 \text{ samples} \quad (3)$$

On the other hand, the number of data items saved at the low sampling rate is calculated by the following Equation (4).

$$(50 \text{ cycles} - 15 \text{ cycles}) \times 24 \text{ samples} = 840 \text{ samples} \quad (4)$$

From the foregoing, the number of data items, per second, having through the compression by the decimation process is:

$$1440 \text{ samples} + 840 \text{ samples} = 2280 \text{ samples} \quad (5)$$

Thus, the data compression ratio is provided by:

$$2280 \text{ samples}/4800 \text{ samples} = 47.5\% \quad (6)$$

Figure 8:
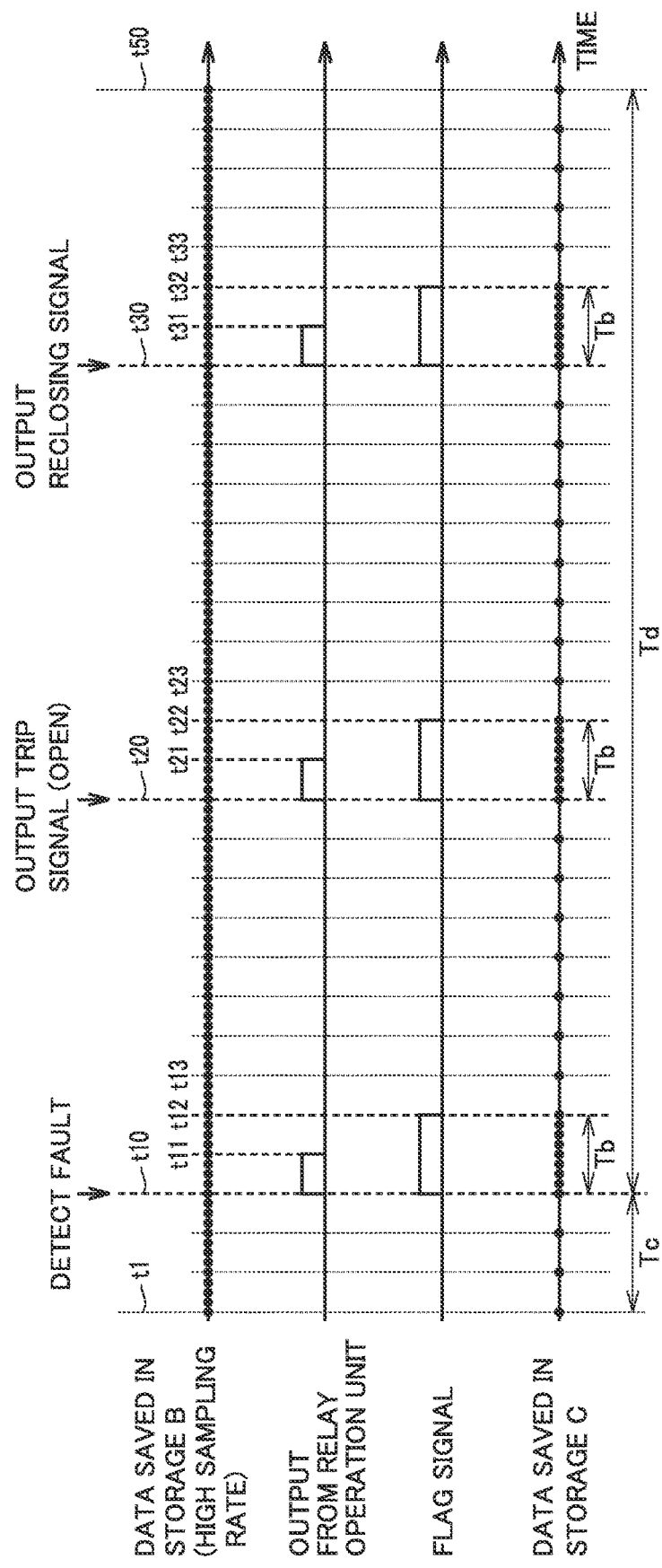
FIG. 8 is a timing chart of another example of operation of decimation operation unit 44 in FIG. 2.

FIG. 8 is a timing chart of another example of the operation of decimation operation unit 44 in FIG. 2. FIG. 8 is the same as FIG. 7, except for the settings of the flag signal by flag setting unit 42. Specifically, in the case of FIG. 8, flag setting unit 42 sets the flag signal to "1" during a predetermined period Tb that is after a rise time of an output signal from relay operation unit 41. In other words, the flag signal is 0 during period Ta.

Specifically, the flag signal is "1" during a period from time t10 to time t12, inclusive of fault detection time t10. The flag signal is "1" during a period from time t20 to time t22, inclusive of a trip signal output time t20. The flag signal is "1" during a period from time t30 to time t32, inclusive of a reclosing signal output time t30. All else in FIG. 8 being the same as those in FIG. 7, and thus the description thereof will not be repeated.

Figure 9:
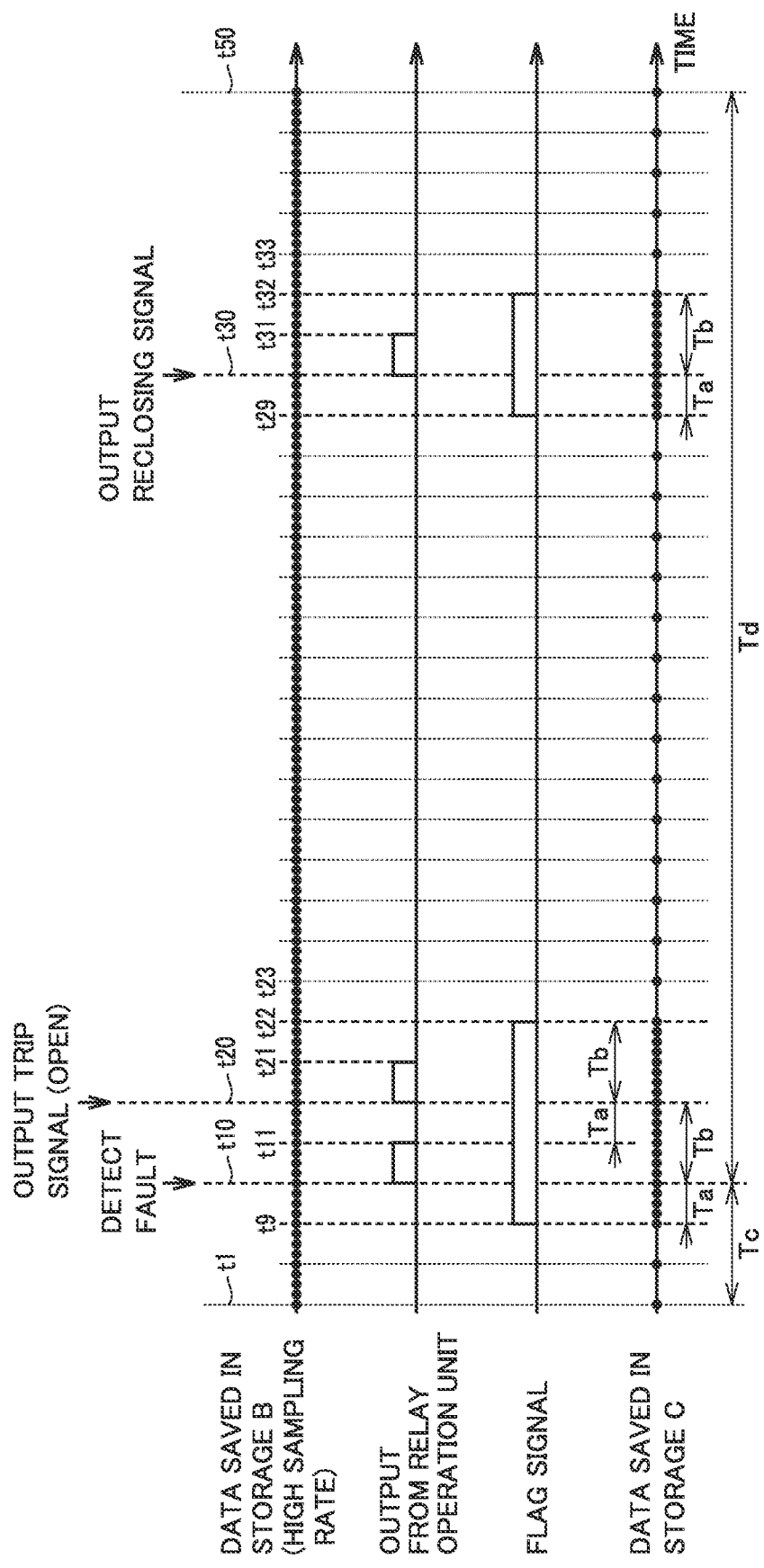
FIG. 9 is a timing chart of still another example of operation of decimation operation unit 44 in FIG. 2.

FIG. 9 is a timing chart of still another example of the operation of decimation operation unit 44 in FIG. 2. In FIG. 9, a trip signal is output after a relatively short time has elapsed since the detection of a fault. For this reason, the period (from time t9 to time t20) during which the flag signal is set to "1" based on the detection of the fault and the period (from time t11 to time t22) during which the flag signal is set to "1" based on output of a trip signal are overlapping. As a result, the flag signal is "1" consecutively from time t9 to time t22. All else in FIG. 9 being the same as those in FIG. 7, and thus the description thereof will not be repeated.

Figure 10:
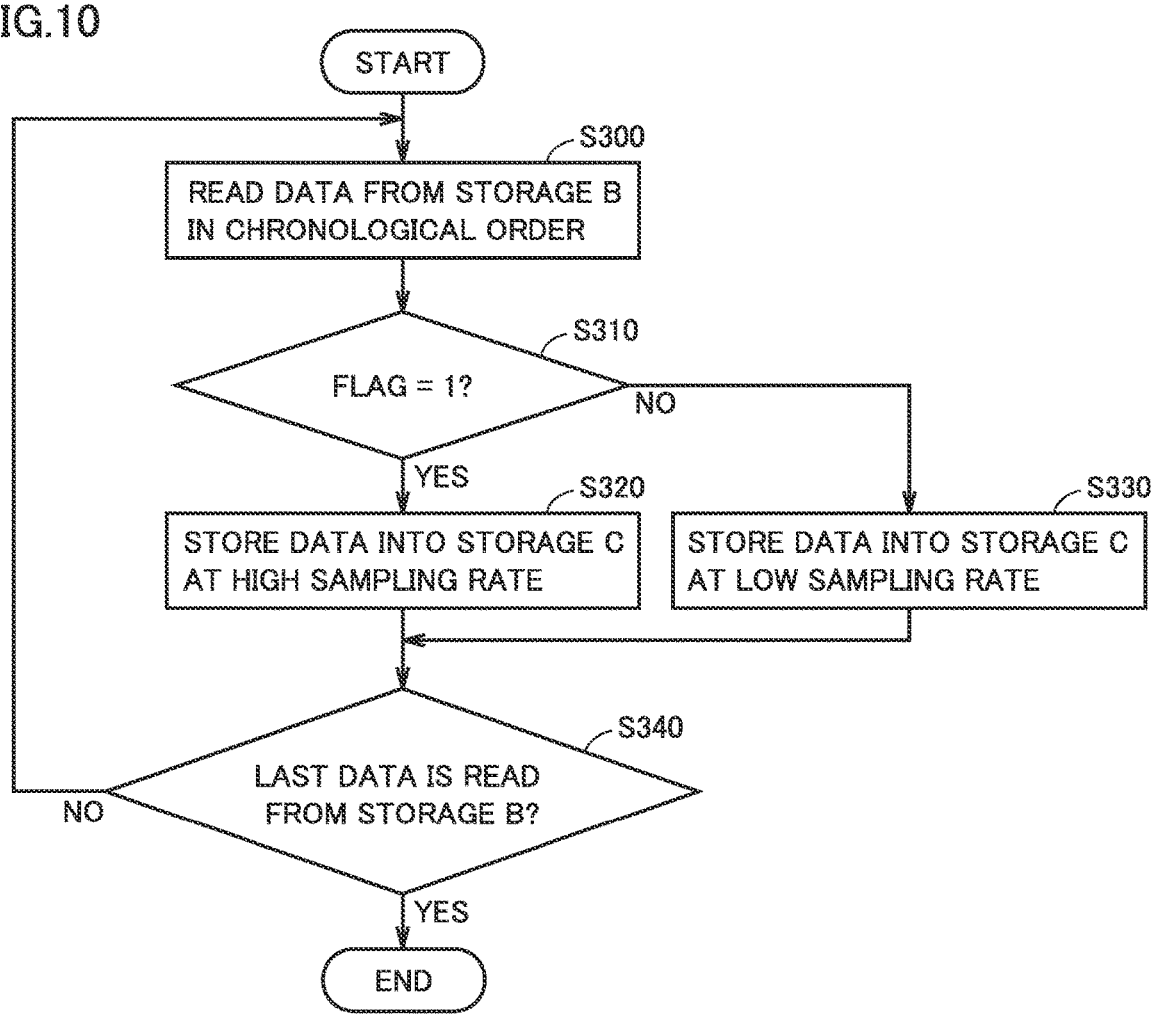
FIG. 10 is a flowchart of an operational procedure of decimation operation unit 44 in FIG. 2.

FIG. 10 is a flowchart of an operational procedure of decimation operation unit 44 in FIG. 2. In the following, referring to FIGS. 2 and 10, an operation of decimation operation unit 44 is described in general. The procedure in FIG. 10 is carried out after the flags of all the data stored in storage B (43) are set according to the procedure in FIG. 6.

Initially, decimation operation unit 44 reads data from storage B (43) in chronological order (successively, starting from the oldest data) (step S300), and determines whether the read data has the flag equal to "1" (step S310). As a result, if the flag is equal to "1" (YES in step S310), decimation operation unit 44 stores data into storage C (45) at the high sampling rate (i.e., data as is read from storage B (43)) (step S320).

On the other hand, if the flag is "0" (NO in step S310), decimation operation unit 44 stores data into storage C (45) at the low sampling rate (i.e., decimate the data read from storage B (43)) (step S330). The foregoing steps S300, S310, S320, and S330 are repeated until the last data is read from storage B (43) (YES in step S340).

6. Interpolation Operation Unit

COMTRADE format (conforming to IEC60255-24) is defined as a data format standard to allow application software 201 included in external device 200 (e.g., a personal computer or a high-level control device) to read fault waveforms recorded in a protection relay. In this format, data is recorded at one sampling rate not variable from one interval to another. Thus, in order to output data stored in storage C (45) to external device 200, interpolation operation unit 46 needs to interpolate the data, if the data is low-rate interval data, to equalize the sampling rate of the data to that of high-rate interval data. In the following, a specific description is given, with reference to the drawings.

Figure 11:
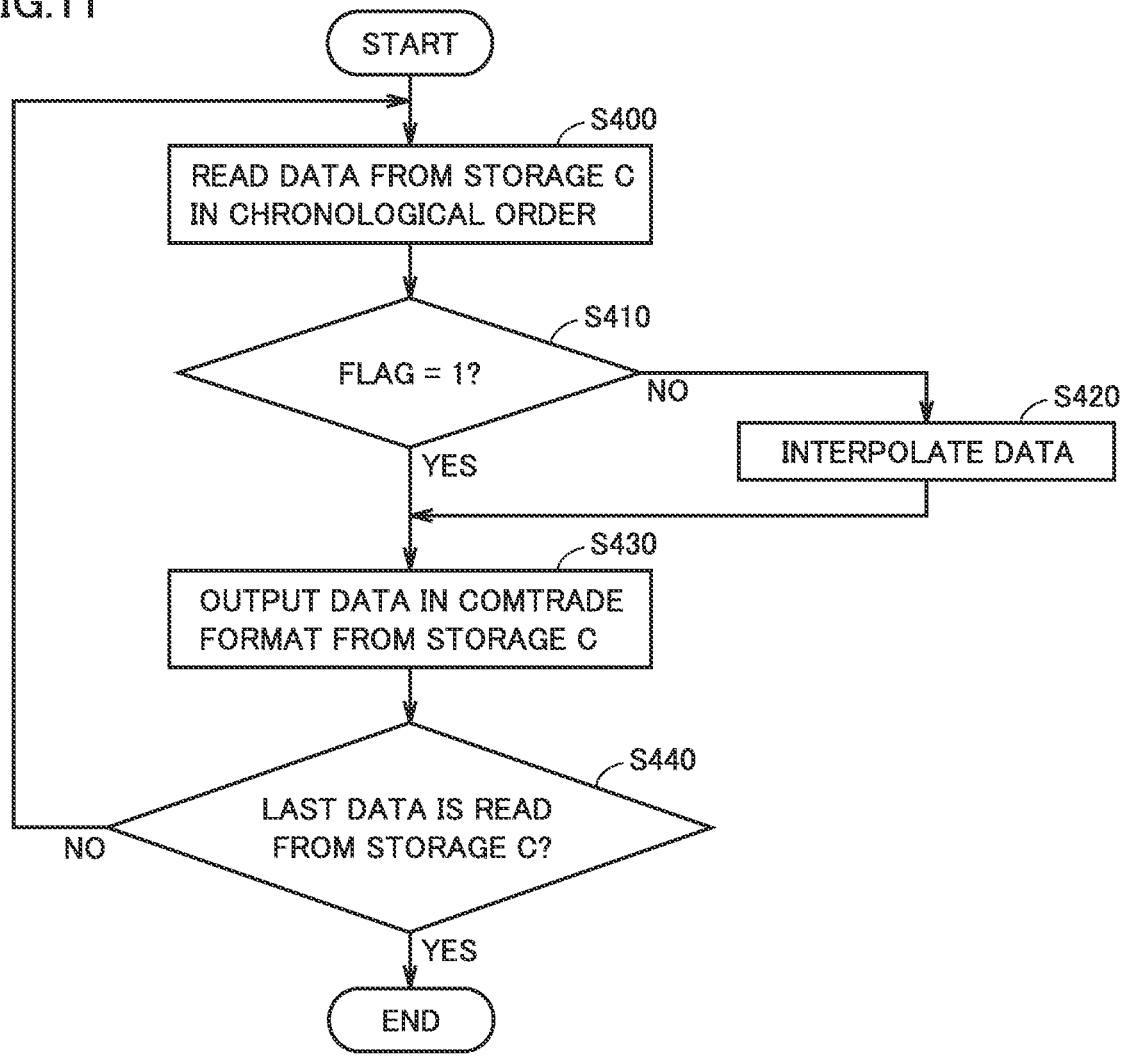
FIG. 11 is a flowchart of an operational procedure of an interpolation operation unit 46 in FIG. 2.

FIG. 11 is a flowchart of an operational procedure of interpolation operation unit 46 in FIG. 2. FIG. 11 shows an example in which time-series data (the entire interval Tc+Td) in the event of a certain fault is output to external device 200.

Referring to FIGS. 2 and 11, initially, interpolation operation unit 46 reads data from storage B (43) in chronological order (successively, starting from the oldest data) (step S400), and determines whether the flag of the read data is equal to "1" (step S410). As a result, if the flag is not equal to "1" (NO in step S410), interpolation operation unit 46 interpolates data before and after the read data (step S420). After the data interpolation, interpolation operation unit 46 outputs the data in COMTRADE format to external device 200 (S430). The foregoing steps S400, S410, S420, and S430 are repeated until the last data is read from storage C (45) (until YES in step S440).

In the following, a specific method of the data interpolation performed in step S420 is described.

6.1 Linear Interpolation

Figure 12:
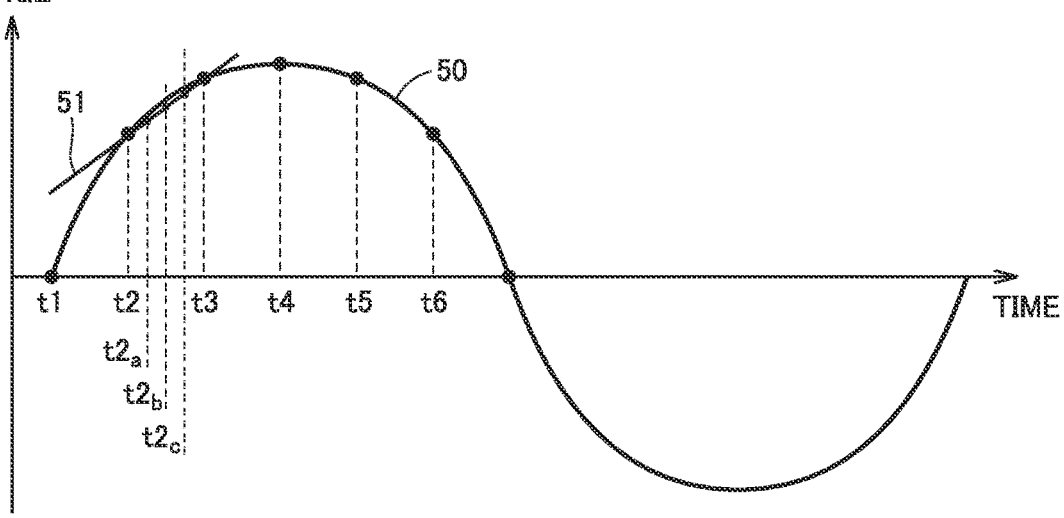
FIG. 12 is a diagram for illustrating an example of data interpolation by linear interpolation.

FIG. 12 is a diagram for illustrating an example of interpolating data by linear interpolation. In FIG. 12, solid dots on a signal 50, representing the detected electrical quantity (current or voltage), indicate waveform data having the low sampling rate obtained by the decimation. An example is to be described in which data is interpolated between the data at time t2 and the data at time t3 by linear approximation. In FIG. 12, data at times $t2_a$, $t2_b$, and $t2_c$ are interpolated by the linear approximation.

Approximated line 51 is represented by the following Equation (7):

$$f(t_i) = q_0 + q_1 \times (w t_i) \quad (7)$$

where $f(t_i)$ represents an electrical quantity at a time $t_i$, w represents an angular frequency of the electrical quantity, and $q_0$ and $q_1$ represent undetermined coefficients.

The simultaneous equations shown in the following Equation (8) hold:

$$\begin{cases} f(t_2) = q_0 + q_1 \times (wt_2) \\ f(t_3) = q_0 + q_1 \times (wt_3) \end{cases} \quad (8)$$

where $f(t_2)$ represents the electrical quantity at time $t_2$, and $f(t_3)$ represents the electrical quantity at time $t_3$.

Rearranging Equation (8) to a matrix, the following Equation (9) holds:

$$\begin{bmatrix} 1 & (wt_2) \\ 1 & (wt_3) \end{bmatrix} \begin{bmatrix} q_0 \\ q_1 \end{bmatrix} = \begin{bmatrix} f(t_2) \\ f(t_3) \end{bmatrix} \quad (9)$$

Solving Equation (9) yields undetermined coefficients $q_0$, and $q_1$. Substituting undetermined coefficients $q_0$, $q_1$ into Equation (7) yields an equation of approximated line 51 connecting the data points at times t2 and t3. Use of the equation of the approximated line gives approximations of the electrical quantity at times $t2_a$, $t2_b$, and $t2_c$. The linear approximation allows data interpolation using simple mathematical operations.

6.2 Sine Wave Interpolation—When Angular Frequency is Known

Figure 13:
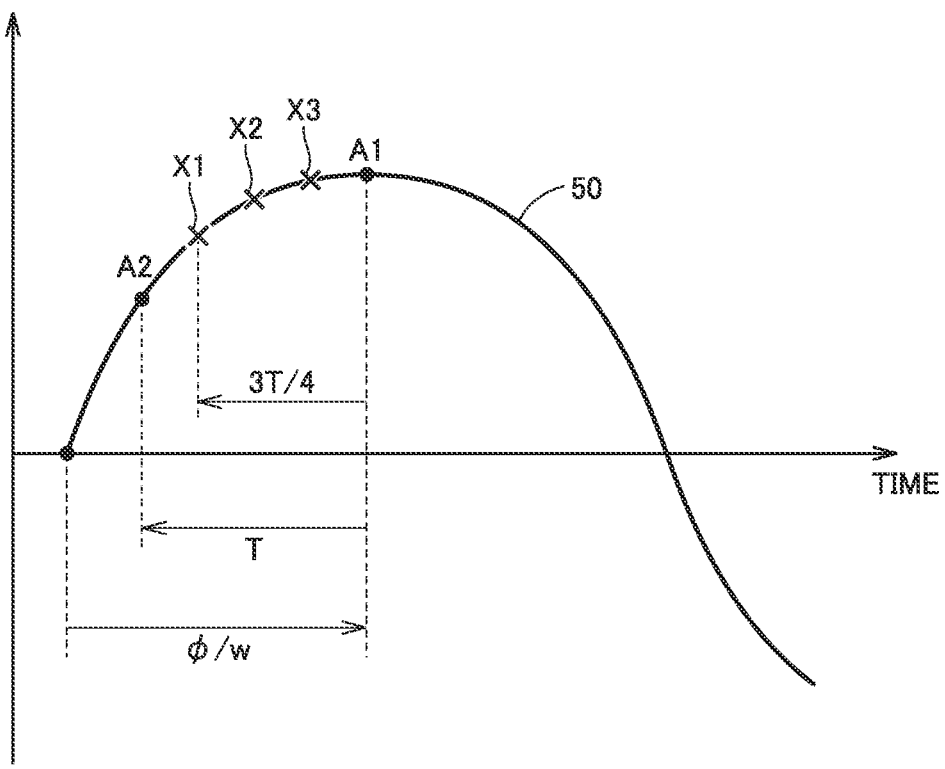
FIG. 13 is a diagram for illustrating an example of data interpolation by a sine wave (when the frequency is known).

FIG. 13 is a diagram for illustrating an example of data interpolation of a sine wave (when the frequency is known). In the following, a method is described which calculates values at the points X1, X2, and X3 by applying the values at points A1 and A2 in FIG. 13 to a sine wave. The values at points A1 and A2 are represented by the following Equations (10) and (11), respectively;

$$A1 = \text{Amp} \times \sin(wt+\varphi) \quad (10)$$

$$A2 = \text{Amp} \times \sin(wt+\varphi-wT) \quad (11)$$

where Amp (unknown) represents the amplitude of the sine wave, φ (unknown) represents the initial phase of point A1, T (known) represents a sampling cycle after the decimation process, and w (known) represents the angular frequency of the electrical quantity.

The values at points X1, X2, and X3 between points A1 and A2 are represented by the following Equation where the phase at each point is represented by θ. In the following Equation (12), X represents the value at each of X1, X2, and X3, and k1 and k2 represent coefficients.

$$X(wt+\varphi-\theta) = A1 \times k1 + A2 \times k2 \quad (12)$$

Figure 14:
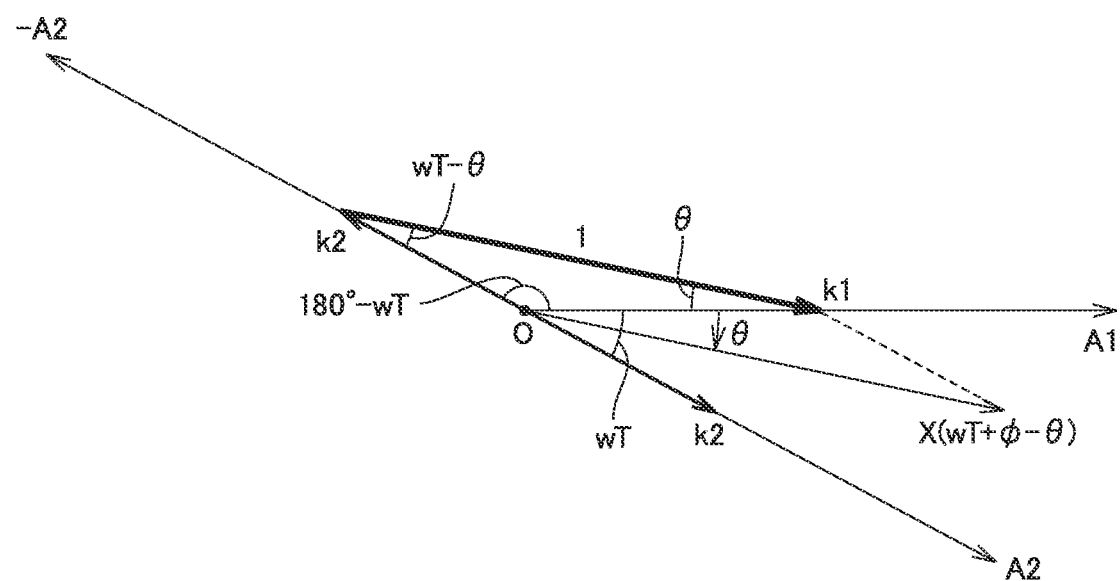
FIG. 14 is a vector diagram for illustrating the principle of the data interpolation of sine wave.

In the following, a method of calculation of the coefficients k1, k2 in Equation (12) is described. FIG. 14 is a vector diagram for illustrating the principle of the data interpolation of sine wave. FIG. 14 shows relationship between the electrical quantity X and points A1 and A2 in Equation (12) in the vector diagram. Although φ=0 for purposes of simplification, the following calculation is extendable at any angle φ.

In FIG. 14, focusing on the triangle formed by the origin O and the vectors k1·A1 and −k2·A2, the following Equation (13) holds by law of sines, giving the coefficients k1 and k2.

$$\frac{1}{\sin(180°-wT)} = \frac{k1}{\sin(wT-\theta)} = \frac{k2}{\sin(\theta)} \Leftrightarrow k1 = \frac{\sin(wT-\theta)}{\sin(180°-wT)} = \quad (13)$$

-continued
$$\frac{\sin(wT-\theta)}{\sin(wT)} \Leftrightarrow k2 = \frac{\sin(\theta)}{\sin(180°-wT)} = \frac{\sin(\theta)}{\sin(wT)}$$

Thus, by using Equations (12) and (13), the value X of the electrical quantity at an arbitrary position (an angle θ between the arbitrary position and point A1) between point A1 and point A2 is given by the following Equation (14):

$$X(wt+\varphi-\theta) = A1 \times \frac{\sin(wT-\theta)}{\sin(wT)} + A2 \times \frac{\sin(\theta)}{\sin(wT)} \quad (14)$$

Specifically, a data value at sample point X1 (a point at a time 3T/4 prior to point A1) in FIG. 10 is given by substituting 3 wT/4 for θ in Equation (14), that is, by the following Equation (15).

$$X(wt+\varphi-3wT/4) = A1 \times \frac{\sin(wT-3wT/4)}{\sin(wT)} + A2 \times \frac{\sin(2wT/4)}{\sin(wT)} \quad (15)$$

A data value at sample point X2 (a point at a time 2T/4 prior to point A1) in FIG. 10 is given by substituting 2 wT/4 for θ in Equation (14), that is, by the following Equation (16).

$$X(wt+\varphi-2wT/4) = A1 \times \frac{\sin(wT-2wT/4)}{\sin(wT)} + A2 \times \frac{\sin(2wT/4)}{\sin(wT)} \quad (16)$$

A data value at sample point X3 (a point at a time T/4 prior to point A1) in FIG. 10 is given by substituting wT/4 for θ in Equation (14), that is, by the following Equation (17).

$$X(wt+\varphi-wT/4) = A1 \times \frac{\sin(wT-wT/4)}{\sin(wT)} + A2 \times \frac{\sin(wT/4)}{\sin(wT)} \quad (17)$$

As described above, the sinusoidal approximation allows more accurate interpolation than the linear approximation. Note that when the angular frequency of the electrical quantity is unknown, the frequency may be calculated by a known method after which the above interpolation method may be applied.

6.3 Interpolation by Polynomial Approximation—When Angular Frequency is Unknown Data points can be interpolated, using an approximating polynomial obtained by expanding a sine wave as a Taylor series. This method is advantageous in that the angular frequency of the electrical quantity may be unknown. In order to interpolate data points using a (n−1)th order approximating polynomial (n unknowns), where n is an integer greater than or equal to 3, values of n known points are necessary. As the degree of Taylor expansion is increased, the accuracy in interpolation increases. However, the unknown increases as well. Thus, it takes time to solve simultaneous equations. For example, when data points are interpolated using the 3rd-order approximating polynomial having four unknowns, the error is within about 0.2%. When data points are interpolated using the 2nd-order approximating polynomial having three unknowns, the error is within about 1-2%. Since the error in the relay operation may fall within 5%, generally, three unknowns suffice. However, considering a case where noise or the like is laid on the data, an approximating polynomial having four unknowns may be employed in practice.

In the following, a case is described where interpolation calculation is performed using the 3rd-order polynomial having four unknowns. Specifically, when values of consecutive data points P1, P2, P3, and P4 are known, a value of an arbitrary point between point P2 and point P3 can be accurately calculated by interpolation as follows. It should be noted that a person skilled in the art would readily appreciate that generalization of the following description allows the arbitrary data point between the above known two data points to be interpolated, using the m+1-th order equation passing through the known two data points and m known data points (where m is an integer greater than or equal to 1) that are consecutive, in chronological order, to at least one of these two data points.

Taylor's expansion around $t=t_i$ is expressed as the following Equation (18). In the Equation (18), f(t) represents the electrical quantity as a function of time.

$$f(t_i) = \frac{f^{(0)}(t_i)}{0!}t_i^0 + \frac{f^{(1)}(t_i)}{1!}t_i^1 + \frac{f^{(2)}(t_i)}{2!}t_i^2 + \frac{f^{(3)}(t_i)}{3!}t_i^3 + \ldots \quad (18)$$

Equation (18) can be rearranged to the following Equation (19) when $f(t)=\text{Amp} \times \sin(wt+\varphi)$, provided that Amp (unknown) represents the amplitude of a sine wave, w (unknown) represents the angular frequency, and $\varphi$ (unknown) represents the initial phase.

$$f(t_i) = \text{Amp} \times \left\{ \sin(wt_i + \varphi) + \frac{w \times \cos(wt_i + \varphi)}{1!}t_i + \frac{-w^2 \times \sin(wt_i + \varphi)}{2!}t_i^2 + \frac{-w^3 \times \cos(wt_i + \varphi)}{3!}t_i^3 + \ldots \right\} \quad (19)$$

Approximation of polynomials up to the 3rd order in Equation (19) is represented by the following Equation (20):

$$f(wt_i) = q_0 + q_1 \cdot (wt_i) + q_2 \cdot (wt_i)^2 + q_3 \cdot (wt_i)^3 \quad (20)$$

where $q_0$, $q_1$, $q_2$, and $q_3$ are undetermined coefficients, w is the angular frequency of the electrical quantity, and $t_i$ is the i-th sampling time.

Since Equation (20) contains four undetermined coefficients, four equations are necessary to determine the values of the undetermined coefficients. Thus, the simultaneous equations according to the following Equation (21) are provided, using the values of the electrical quantities at times $t_1$, $t_2$, $t_3$, and $t_4$:

$$\begin{cases} f(t_1) = q_0 + q_1 \cdot (wt_1) + q_2 \cdot (wt_1)^2 + q_3 \cdot (wt_1)^3 \\ f(t_2) = q_0 + q_1 \cdot (wt_2) + q_2 \cdot (wt_2)^2 + q_3 \cdot (wt_2)^3 \\ f(t_3) = q_0 + q_1 \cdot (wt_3) + q_2 \cdot (wt_3)^2 + q_3 \cdot (wt_3)^3 \\ f(t_4) = q_0 + q_1 \cdot (wt_4) + q_2 \cdot (wt_4)^2 + q_3 \cdot (wt_4)^3 \end{cases} \quad (21)$$

Rearranging Equation (21) to a matrix yields the following Equation (22).

$$\begin{bmatrix} 1 & wt_1 & (wt_1)^2 & (wt_1)^3 \\ 1 & wt_2 & (wt_2)^2 & (wt_2)^3 \\ 1 & wt_3 & (wt_3)^2 & (wt_3)^3 \\ 1 & wt_4 & (wt_4)^2 & (wt_4)^3 \end{bmatrix} \begin{bmatrix} q_0 \\ q_1 \\ q_2 \\ q_3 \end{bmatrix} = \begin{bmatrix} f(t_1) \\ f(t_2) \\ f(t_3) \\ f(t_4) \end{bmatrix} \quad (22)$$

Thus, solving Equation (22) yields undetermined coefficients $q_0$, $q_1$, $q_2$, and $q_3$. Substituting the obtained undetermined coefficients into Equation (20) provides an approximating polynomial of the sine wave passing through the four sample points at times $t_1$, $t_2$, $t_3$, and $t_4$.

By way of example, phase $wt_1$ at time $t_1$ is 0°, phase $wt_2$ at time $t_2$ is 30°, phase $wt_3$ at time $t_3$ is 60°, and phase $wt_4$ at time $t_4$ is 90°. In this case, Equation (22) is rearranged to the following Equation (23) where the electrical quantities at times $t_1$, $t_2$, $t_3$, and $t_4$ are sin (0°), sin (30°), sin (60°), and sin (90°), respectively.

$$\begin{bmatrix} 1 & wt_1 & (wt_1)^2 & (wt_1)^3 \\ 1 & wt_2 & (wt_2)^2 & (wt_2)^3 \\ 1 & wt_3 & (wt_3)^2 & (wt_3)^3 \\ 1 & wt_4 & (wt_4)^2 & (wt_4)^3 \end{bmatrix} \begin{bmatrix} q_0 \\ q_1 \\ q_2 \\ q_3 \end{bmatrix} = \begin{bmatrix} f(t_1) \\ f(t_2) \\ f(t_3) \\ f(t_4) \end{bmatrix} \Leftrightarrow \quad (23)$$

$$\begin{bmatrix} 1 & 0° & (0°)^2 & (0°)^3 \\ 1 & 30° & (30°)^2 & (30°)^3 \\ 1 & 60° & (60°)^2 & (60°)^3 \\ 1 & 90° & (90°)^2 & (90°)^3 \end{bmatrix} \begin{bmatrix} q_0 \\ q_1 \\ q_2 \\ q_3 \end{bmatrix} = \begin{bmatrix} \sin(0°) \\ \sin(30°) \\ \sin(60°) \\ \sin(90°) \end{bmatrix}$$

Solving Equation (23) yields undetermined coefficients $q_0$, $q_1$, $q_2$, $q_3$, that is, $q_0=0$, $q_1=1.0204287262954$, $q_2=-0.0654708250141$, and $q_3=-0.1138718883605$. Substituting these coefficients into Equation (20) yields the following Equation (24).

$$f(wt_i)=1.0204287262954 \times (wt_i) - 0.0654708250141 \times (wt_i)^2 - 0.1138718883605 \times (wt_i)^3 \quad (24)$$

When wt=37.5°, Equation (24) yields f(wt)=0.6078976. When wt=45°, f(wt)=0.7058893. When wt=52.5°, f(wt)=0.7924427.

Figure 15A:
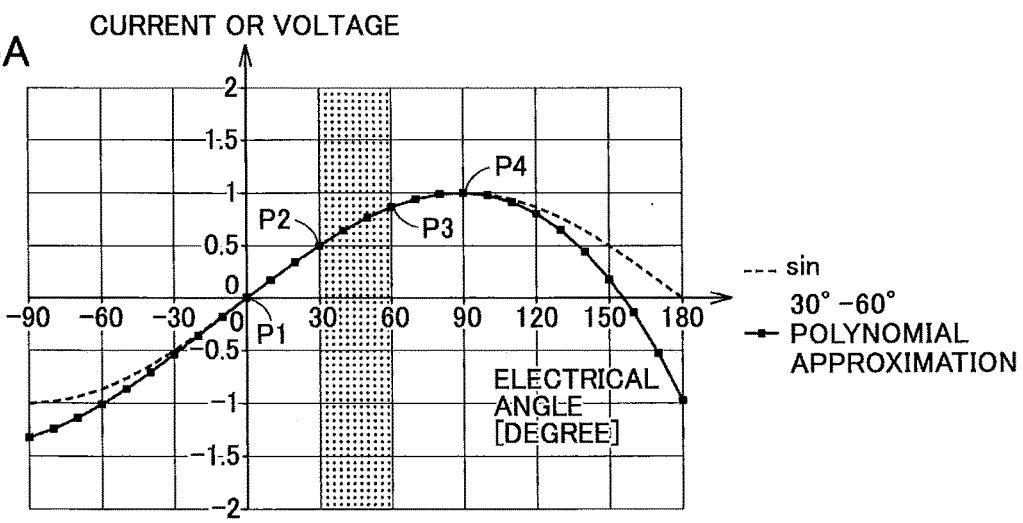
FIGS. 15A-15C are diagrams each showing an example of data interpolation by polynomial approximation.
Figure 15B:
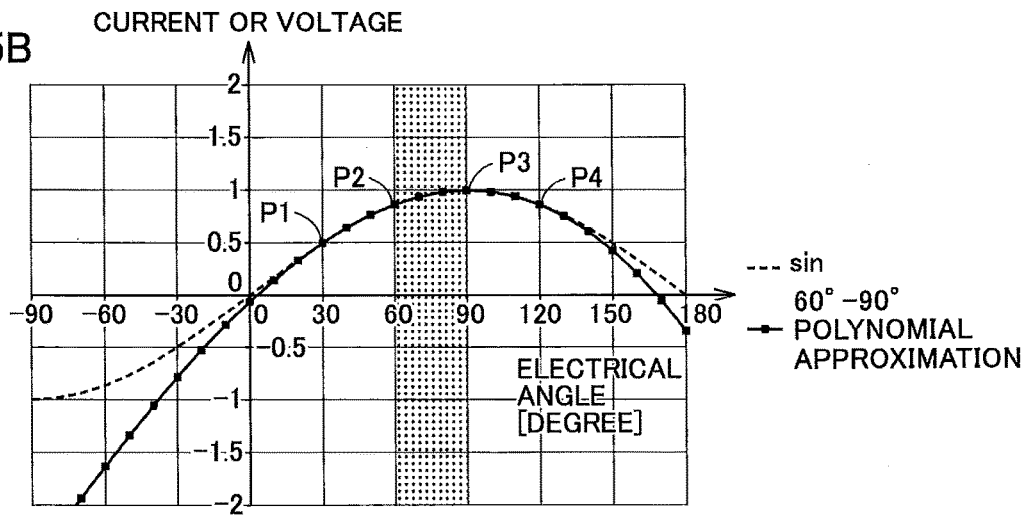
Figure 15C:
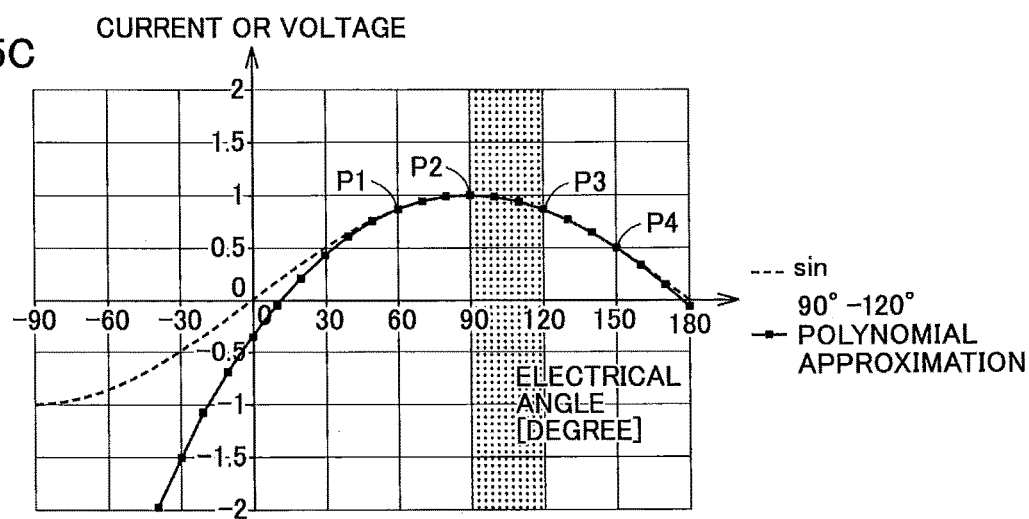

FIGS. 15A-15C are diagrams each showing an example in which points are interpolated by polynomial approximation. In FIG. 15A, the points between sample point P2 and sample point P3 are interpolated by the above polynomial approximation, using sample point P1 (0°), sample point P2 (30°), sample point P3 (60°), and sample point P4 (90°). In FIG. 15B, the points between sample point P2 and sample point P3 are interpolated by the above polynomial approximation, using sample point P1 (30°), sample point P2 (60°), sample point P3 (90°), and sample point P4 (120°). In FIG. 15C, the points between sample point P2 and sample point P3 are interpolated by the above polynomial approximation, using sample point P1 (60°), sample point P2 (90°), sample point P3 (120°), and sample point P4 (150°).

Effects

As described above, according to the fault waveform recording device of Embodiment 1, waveform data before and after the fault detection time is divided into high-rate interval data and low-rate interval data, based on an abnormality detection time at which a variation range of an electrical quantity exceeds a threshold. Since the sampling rate of the low-rate interval data is decreased by the decimation process, an amount of waveform data to be stored in the event of a fault in the power system can be reduced.

Further, according to the present embodiment, a method is provided which increases by a highly accurate interpolation process the sampling rate of the low-rate interval data, obtained by the decimation process, back to the same sampling rate as that of high-rate interval data. This allows support of the COMTRADE format.

Embodiment 2

Figure 16:
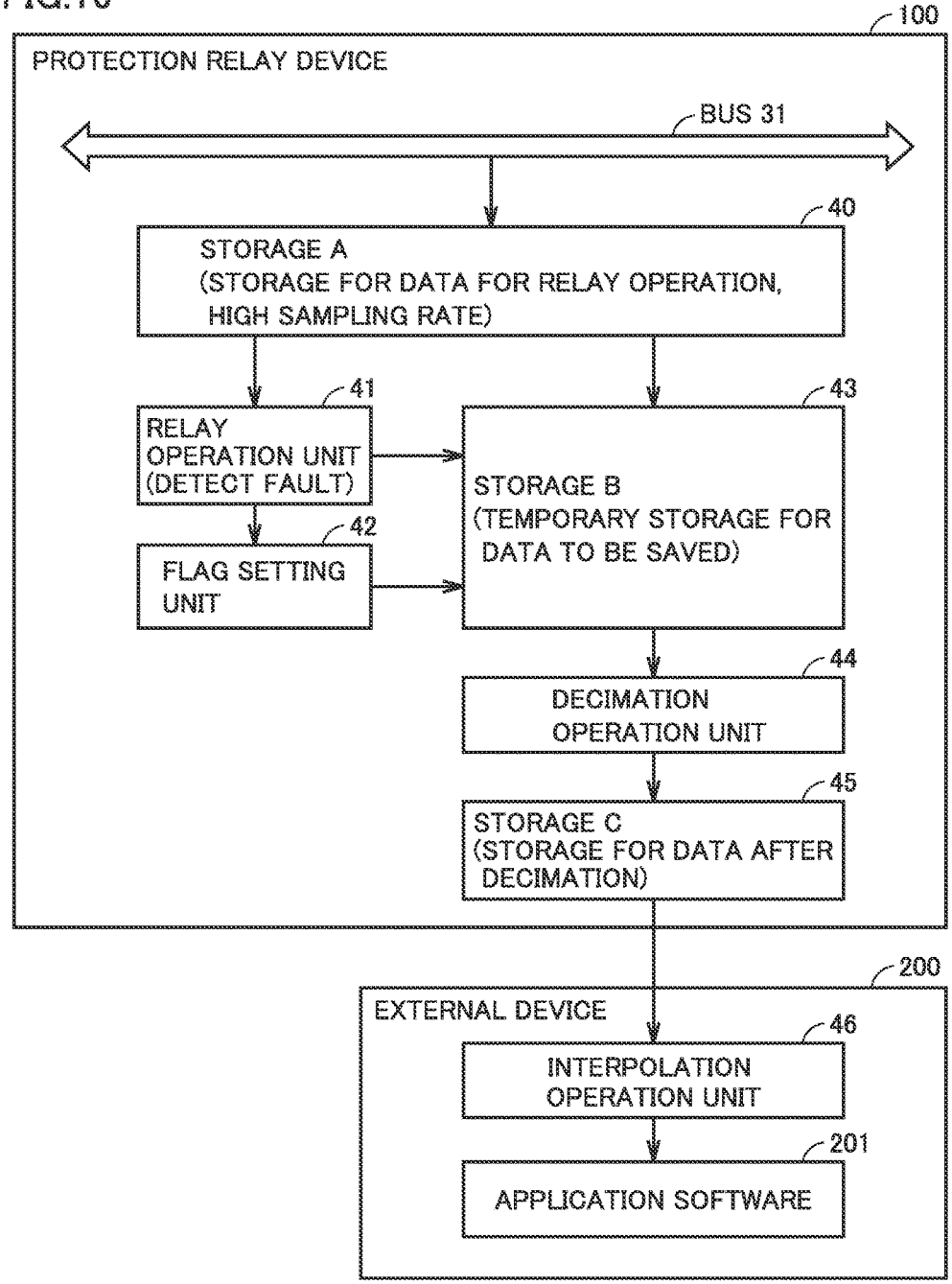
FIG. 16 is a block diagram of a functional configuration of a fault waveform recording device according to Embodiment 2.

FIG. 16 is a block diagram of a functional configuration of a fault waveform recording device according to Embodiment 2. According to the fault waveform recording device in FIG. 16, interpolation operation unit 46 is included in an external device 200, rather than in a protection relay device 100. In this case, the fault waveform recording device includes both protection relay device 100 and external device 200.

Referring to FIG. 16, a CPU (not shown) included in protection relay device 100 outputs to external device 200 the data as is obtained by the decimation process and stored in storage C (45). Interpolation operation unit 46 included in external device 200 applies an interpolation process to the data input from protection relay device 100. The function of interpolation operation unit 46 is implemented by a program being executed by a CPU (not shown) included in external device 200. Other functions of the components in FIG. 16 are the same as those described in Embodiment 1, and thus and the description thereof will not be repeated.

The configuration of the fault waveform recording device shown in FIG. 16 yields the same advantageous effects as the fault waveform recording device according to Embodiment 1 shown in FIG. 2, etc.

The embodiments presently disclosed should be considered in all aspects illustrative and not restrictive. The scope of the present invention is defined by the appended claims, rather than by the above description. All changes which come within the meaning and range of equivalency of the appended claims are to be embraced within their scope.

REFERENCE SIGNS LIST 1 power-transmission line; 2 current transformer; 3 voltage transformer; 4 circuit breaker; 10 input converter; 11 auxiliary transformer; 20 AD converter; 30 processing unit; 31 bus; 32 CPU; 33 RAM; 34 ROM; 35 non-volatile memory; 36 digital output circuit; 37 digital input circuit; 40 storage A; 41 relay operation unit; 42 flag setting unit; 43 storage B; 44 decimation operation unit; 45 storage C; 46 interpolation operation unit; 100 protection relay device; 200 external device; 201 application software.

The invention claimed is:

1. A fault waveform recording device, comprising:
an analog-to-digital (AD) converter;
a first storage;
a second storage; and
a first operation unit,
said AD converter sampling and converting a signal received from at least one of a current transformer and a voltage transformer of a power system, said signal representing a latest electrical quantity during a first period and detected in the power system at a constant sampling frequency;
said first operation unit being configured to:
store the data representing said converted signal into the first storage while successively updating the data;
halt the updating of the data stored in the first storage after a second period has elapsed since an initial abnormality detection time at which an initial abnormality of the electrical quantity, among a plurality of abnormalities, in the power system is detected, the plurality of abnormalities resulting from an event of a fault and an event of switching of a circuit breaker associated with the fault, the plurality of abnormalities each including a variation in amplitude and/or phase of the electrical quantity beyond a threshold, the second period being shorter than the first period,
provide a flag storage area for each data in the first period stored in the first storage after the updating of the data is halted;
initially set a first flag to the flag storage area for each data in the first period;
for each of the plurality of abnormalities, change the first flag to a second flag in the flag storage area for each data detected during an interval from a first time prior to the abnormality detection time to a second time after the abnormality detection time;
for each data corresponding to the second flag, store the data as is read from the first storage into the second storage; and
for each data corresponding to the first flag, decimate the data read from the first storage to a low sampling rate signal, and store the decimated data into the second storage, to thereby reduce an amount of waveform data to be stored in the event of a fault in the power system.

2. The fault waveform recording device according to claim 1, wherein
the first operation unit is configured to determine that an abnormality of the electric quantity has occurred when an absolute value of a difference between a value of the electrical quantity at a current time and a value of the electrical quantity one cycle prior to the current time exceeds a threshold.

3. The fault waveform recording device according to claim 1, wherein
the first operation unit is configured to determine that an abnormality of the electric quantity has occurred when an absolute value of a sum of a value of the electrical quantity at a current time and a value of the electrical quantity half a cycle prior to the current time exceeds a threshold.

4. The fault waveform recording device according to claim 1, wherein
the first operation unit is configured to determine that an abnormality of the electric quantity has occurred when an absolute value of a difference between a result of calculation of the amplitude of the electrical quantity at a current time and a result of calculation of the amplitude of the electrical quantity at a time a predetermined period prior to the current time exceeds a threshold.

5. The fault waveform recording device according to claim 1, further comprising:
a second operation unit which interpolates the decimated non-abnormality-interval data stored in the second storage, wherein
a sampling rate of the interpolated data is equal to a sampling rate of the data corresponding to the second flag.

6. The fault waveform recording device according to claim 5, wherein
the second operation unit interpolates an arbitrary data point between known two data points, using an approximated line connecting the known two data points.

7. The fault waveform recording device according to claim 5, wherein
the second operation unit interpolates an arbitrary data point between known two data points by applying the known two data points to a sine wave having a known frequency.

8. The fault waveform recording device according to claim 5, wherein the second operation unit interpolates an arbitrary data point between known two data points, using m+1-th order equation passing through the known two data points and m known data point that is consecutive, in chronological order, to at least one of the two data points, where m is an integer greater than or equal to 1.

* * * * *